United States Patent
Hayashi

(10) Patent No.: US 8,022,625 B2
(45) Date of Patent: Sep. 20, 2011

(54) ELECTRO-LUMINESCENCE DEVICE FOR IMPROVED DISPLAY QUALITY BY SUPPRESSING IRREGULARITY OF THE GAP AND METHOD OF MANUFACTURING ELECTRO-LUMINESCENCE DEVICE

(75) Inventor: Kenji Hayashi, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 502 days.

(21) Appl. No.: 12/103,345

(22) Filed: Apr. 15, 2008

(65) Prior Publication Data
US 2008/0284331 A1    Nov. 20, 2008

(30) Foreign Application Priority Data
May 17, 2007    (JP) ................................. 2007-131319

(51) Int. Cl.
*H01L 51/52* (2006.01)
*H05B 33/02* (2006.01)

(52) U.S. Cl. ........ 313/512; 313/501; 313/502; 313/498; 428/212; 428/217

(58) Field of Classification Search .......... 313/501–512; 445/24–25
See application file for complete search history.

(56) References Cited

U.S. PATENT DOCUMENTS

| | | | |
|---|---|---|---|
| 2003/0017777 A1* | 1/2003 | Matsuoka et al. | 445/24 |
| 2006/0012296 A1* | 1/2006 | Eida et al. | 313/509 |
| 2006/0158111 A1* | 7/2006 | Hayashi | 313/512 |
| 2007/0228934 A1* | 10/2007 | Tanaka et al. | 313/503 |
| 2007/0273018 A1* | 11/2007 | Onozuka et al. | 257/690 |

FOREIGN PATENT DOCUMENTS

| | | |
|---|---|---|
| JP | A 2001-267070 | 9/2001 |
| JP | A 2004-355918 | 12/2004 |
| JP | A 2005-011573 | 1/2005 |
| JP | A 2007-42467 | 2/2007 |
| JP | A 2007-141750 | 6/2007 |

\* cited by examiner

*Primary Examiner* — Anne M Hines
*Assistant Examiner* — Tracie Green
(74) *Attorney, Agent, or Firm* — Oliff & Berridge PLC

(57) ABSTRACT

There is provided an electro-luminescence device in which a display base substrate including a display body layer having a switching element disposed in the shape of a matrix and a light emitting element having a light emitting state controlled by the switching element and a sealing layer having a gas barrier layer that is formed on the display body layer and has at least a function for blocking water vapor and a protection substrate made of a translucent material and having a surface on which at least two types of gap control layers made of different materials are stacked are bonded such that a gap control layer, disposed on the uppermost layer, of the gap control layers and the gas barrier layer are brought into contact with each other, wherein the gap control layer disposed on the uppermost layer has a Young's modulus lower than the gas barrier layer.

13 Claims, 6 Drawing Sheets

ELECTRO-LUMINESCENCE DEVICE FOR IMPROVED DISPLAY QUALITY BY SUPPRESSING IRREGULARITY OF THE GAP AND METHOD OF MANUFACTURING ELECTRO-LUMINESCENCE DEVICE

BACKGROUND

1. Technical Field

The present invention relates to an electro-luminescence device and a method of manufacturing the electro-luminescence device.

2. Related Art

As one of devices using an electro-luminescence phenomenon, there is an organic electro-luminescence device of an active matrix type. In the active matrix type, two or more TFTs including a switching TFT that controls a pixel, electrode that is an anode and a TFT for supplying a drive current are needed for each pixel. Accordingly, in order to achieve acquisition of a TFT forming area and improvement of an aperture ratio together, it is preferable to use a top emission type in which a function layer (a layer that is pinched by an anode and a cathode layer and includes at least an organic electro-luminescence emitting layer) can be formed on the upper surface of the TFT. In addition, when a color display is required, it is difficult to emit one color among three primary colors for each pixel by forming electrically independent function layers with high precision at low cost using different materials for each pixel. Accordingly, generally, a function layer for emitting white light is formed over the whole surface of the image display area, and then a color filter is bonded on the function layer through a cathode layer or the like, and thereby a color image can be displayed (see JP-A-2001-267070).

In the above-described electro-luminescence device, there are problems in a sealing property and a method of installing the color filter. Since the above-described function layer contains an organic material or metal that can be easily reacted with moisture, it is deteriorated due to the moisture (water vapor). Thus, means (configuration) for suppressing permeation of external air is needed. In addition, when a gap (hereinafter, referred to as a gap) between the function layer and the color filter is irregular in the display area, deterioration of the display quality such as a change in chromaticity depending on a viewing angle may occur. Accordingly, means (configuration) for suppressing the irregularity of the gap in the above-described bonding process and maintaining the state for a long time is needed. Thus, in the above-described electro-luminescence device, a thin film that is formed of a silicon oxide film, a silicon nitride film, or the like and transparent and has a superior water vapor blocking property, referred to as a gas barrier layer is formed on the function layer. In addition, a color filter is bonded to the top of the gas barrier layer using an adhesive in which a sphere-shaped gap control layer having an approximately same size as the color filter is mixed, and thereby the irregularity and variance of the gap is suppressed.

However, when the above-described bonding method using the sphere-shaped gap control layer is used, the gas barrier layer and the gap control layer are pressed in a state that they are brought into point contact with each other, and accordingly damage such as a local breakage may occur in the gas barrier layer. In addition, when the gap control layer is formed of a material having a low Young's modulus for avoiding the above-described situation, there is a problem that the irregularity of the gap may increase.

SUMMARY

An advantage of some aspects of the invention is that provides an electro-luminescence device having improved display capability and display quality by suppressing the irregularity of the gap without incurring any damage of the gas barrier layer.

According to a first aspect of the present invention, there is provided an electro-luminescence device in which a display base substrate including a display body layer having a switching element disclosed in the shape of a matrix and a light emitting element having a light emitting state controlled by the switching element and a sealing layer having a gas barrier layer that is formed on the display body layer and has at least a function for blocking water vapor and a protection substrate made of a translucent material and having a surface on which at least two types of gap control layers made of different materials are stacked are bonded such that a gap control layer, disposed on the uppermost layer, of the gap control layers and the gas barrier layer are brought into contact with each other. In addition, the gap control layer disposed on the uppermost layer has a Young's modulus lower than the gas barrier layer.

Since the Young's modulus of the gap control layer of the uppermost layer is low and both sides of the gap control layer are brought into surface contact, a local damage in the gas barrier layer is suppressed. In addition, since any arbitrary film thickness of the gap control layer can be chosen in a forming process thereof any arbitrary gap can be formed by covering deformation of the gap control layer of the uppermost layer due to its low Young's modulus.

According to the above-described configuration, the gas barrier layer having a superior sealing property can be formed on the display base substrate and the protection substrate can be bonded to the gas barrier layer with any arbitrary gap, and thereby the display capability of the electro-luminescence device can be improved and aged deterioration due to permeation of water vapor can be suppressed.

According to a second aspect of the invention, there is provided an electro-luminescence device in which a display base substrate including a display body layer having a switching element disposed in the shape of a matrix and a light emitting element having a light emitting state controlled by the switching element and a sealing layer having a gas barrier layer that is formed on the display body layer and has at least a function for blocking water vapor and a protection substrate made of a translucent material and having a color filter layer, a first gap control layer formed on the color filter layer, and a second gap control layer formed on the first gap control layer are bonded such that the second gap control layer and the gas barrier layer are brought into contact with each other. In addition, the Young's modulus of the second gap control layer is lower than those of the first gap control layer and the gas barrier layer.

Since the first gap control layer has a Young's modulus higher than the second gap control layer and is deformed rarely, deformation due to pressure for bonding the display body and the protection substrate together can be suppressed. According, under the configuration, irregularity of the gap in the display area can be further suppressed, and thereby an electro-luminescence device of which aged deterioration due to permeation of water vapor is suppressed and display capability is further improved can be acquired.

The sealing layer may include at least three types of material layers including a cathode protecting layer, an organic buffer layer, and the gas barrier layer which are sequentially stacked on the display body layer.

Although a metal film having a very thin film thickness is used for translucency as the cathode layer that is the uppermost layer of the light emitting element, a cathode protecting layer is formed thereon, and accordingly, the effect of depression or disconnection of the cathode due to forming a coat of the organic buffer layer and weighting of the protection substrate applied by bonding the display base substrate and the protection substrate together can be reduced. In addition, unevenness of a pixel partition wall, a wiring, or the like is flattened by forming the organic buffer layer on the upper layer thereof, and thereby occurrence of defection such as a crack in the gas barrier layer can be suppressed. Thereby, by using the above-described configuration, an electro-luminescence device of which aged deterioration is further suppressed and display capability is further improved can be acquired.

The Young's modulus of the organic buffer layer may be higher than that of the second gap control layer.

Since the gas barrier layer is a thin film made of an inorganic compound that is made of silicon oxynitride or the like and has a high Young's modulus, the gas barrier layer may have a damage such as depression, a crack, or the like in a case where the lower layer, that is, a layer forming the base thereof is deformed. However, when the Young's modulus of the organic buffer layer is higher than that of the second gap control layer, the pressure in the bonding process is absorbed by deformation of the second gap control layer, and accordingly, the deformation of the organic buffer layer is suppressed.

Accordingly, by using the above-described configuration, damage of the gas barrier layer is suppressed due to deformation of the organic buffer layer, and thereby an electro-luminescence device of which aged deterioration is further suppressed and display capability is further improved can be acquired.

The second gap control layer may be patterned and disposed locally on the first gap control layer.

The positions of the light emitting element and the color filter layer are needed to be adjusted by relatively moving the display base substrate and the protection substrate horizontally with the second gap control layer brought into contact with the gas barrier layer for bonding the display base substrate and the protection substrate together. In such a case, according the above-described second gap control layer, abrasive resistance for horizontal movement is reduced, and accordingly, the degree of precision of the position adjustment is improved and the occurrence of damage, deformation, or the like in the side portion of the second gap control layer is suppressed. Thereby, an electro-luminescence device of which display capability is further improved can be acquired.

It may be configured that the color filter layer is formed by a color filter colored in one of three primary colors including red, green, and blue colors and a black matrix that is formed of a light shielding material and spaces the color filter apart and at least any one between the first gap control layer and the second gap control layer is disposed only on the black matrix.

In such a case, the material disposed on the black matrix is not required to have translucency, and accordingly, the range of selection of the material is broadened. Accordingly, the material of the gap control layer can be chosen with focus on the cost, patterning, or the like, and thus an advantage such as improved quality or reduction of the cost can be acquired. In addition, by using a gap control layer made of a light shielding material, leakage of light in the pixels can be prevented, and thereby high-precision display with high color reproducibility can be made.

It may be configured that the second gap control layer is patterned and a shape tapered forward at 10 to 60 degrees is formed on a side portion of the second gap control layer which is formed by the patterning process.

The positions of the light emitting element and the color filter are needed to be adjusted by relatively moving the display base substrate and the protection substrate horizontally with the second gap control layer brought into contact with the gas barrier layer for bonding the display base substrate and the protection substrate together. In such a case, according the above-described second gap control layer, resistance for movement is reduced, and accordingly, the degree of precision of the position adjustment is improved and the occurrence of damage, deformation, or the like in the side portion is suppressed. Thereby, an electro-luminescence device of which display capability is further improved can be acquired.

Concave and convex portions may be formed on a surface of the second gap control layer.

The positions of the light emitting element and the color filter are needed to be adjusted by relatively moving the display base substrate and the protection substrate horizontally with the second gap control layer brought into contact with the gas barrier layer for bonding the display base substrate and the protection substrate together. In such a case, according the above-described second gap control layer, abrasive resistance for movement is reduced, and thus, the degree of precision of the position adjustment is improved, and thereby, an electro-luminescence device of which display capability is further improved can be acquired.

A film thickness of the second gap control layer may be smaller than that of the first gap control layer.

In such a case, the irregularity of the gap can be further suppressed. Thereby, an electro-luminescence device of which display capability is further improved can be acquired.

According to a third aspect of the invention, there is provided a method of manufacturing an electro-luminescence device which includes bonding a first substrate having a gas barrier layer that is formed of a material having a high Young's modulus for protecting a group of elements formed on a surface of the first substrate and is disposed in an uppermost layer and a second substrate having a surface on which gap control layers of two layers or more are included such that the gas barrier layer and the gap control layers are brought into contact with each other. In addition, a gap control layer of an uppermost layer among the gap control layers of two layers or more is formed of a material having a Young's modulus lower than those of a gap control layer of a layer disposed lower than the gap control layer of the uppermost layer and the gas barrier layer, and the unevenness of the surface of the gas barrier is absorbed by the gap control layer of the uppermost layer.

According to the manufacturing method, the first substrate and the second substrate can be brought into contact with each other for being fixed without incurring any damage in the gas barrier layer. Accordingly, protection of the group of the elements and uniformity of a gap between the first substrate and the second substrate can be achieved together. Therefore, the display quality of the electro-luminescence device can be improved without lowering the reliability thereof.

According to a fourth aspect of the invention, there is provided a method of manufacturing an electro-luminescence device which includes bonding a display base substrate including a display body layer having a switching element disposed in the shape of a matrix and a light emitting element having a light emitting state controlled by the switching element and a sealing layer having a gas barrier layer that is formed on the display body layer and has at least a function for blocking water vapor and a protection substrate made of a translucent material and having a color filter layer, a first gap control layer formed on the color filter layer, and a second gap control layer formed on the first gap control layer by overlapping and weighting the display base substrate and the protection substrate such that the second gap control layer and the gas barrier layer are brought into contact with each other. In addition, the second gap control layer is formed of a material having a Young's modulus lower than those of the first gap control layer and the gas barrier layer, and the second gap control layer contacts the gas barrier layer without depressing the gas barrier layer while absorbing unevenness of the gas barrier layer and maintains a gap between the display body layer and the color filter layer to be approximately constant.

According to the manufacturing method, the gap between the display body layer and the color filter layer can be maintained to be approximately constant without incurring any damage of the gas barrier layer. Therefore, the display quality of the electro-luminescence device can be improved without lowering the reliability thereof.

The bonding of the display base substrate and the protection substrate may include relatively moving the display base substrate and the protection substrate horizontally in a state that the second gap control layer and the gas barrier layer are brought into contact with each other.

In such a case, the relative positions of the light emitting element and the color filter can be adjusted to be close with high precision without incurring any damage of the gas barrier layer, and therefore, the display quality of the electro-luminescence device can be further improved without lowering the reliability thereof.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
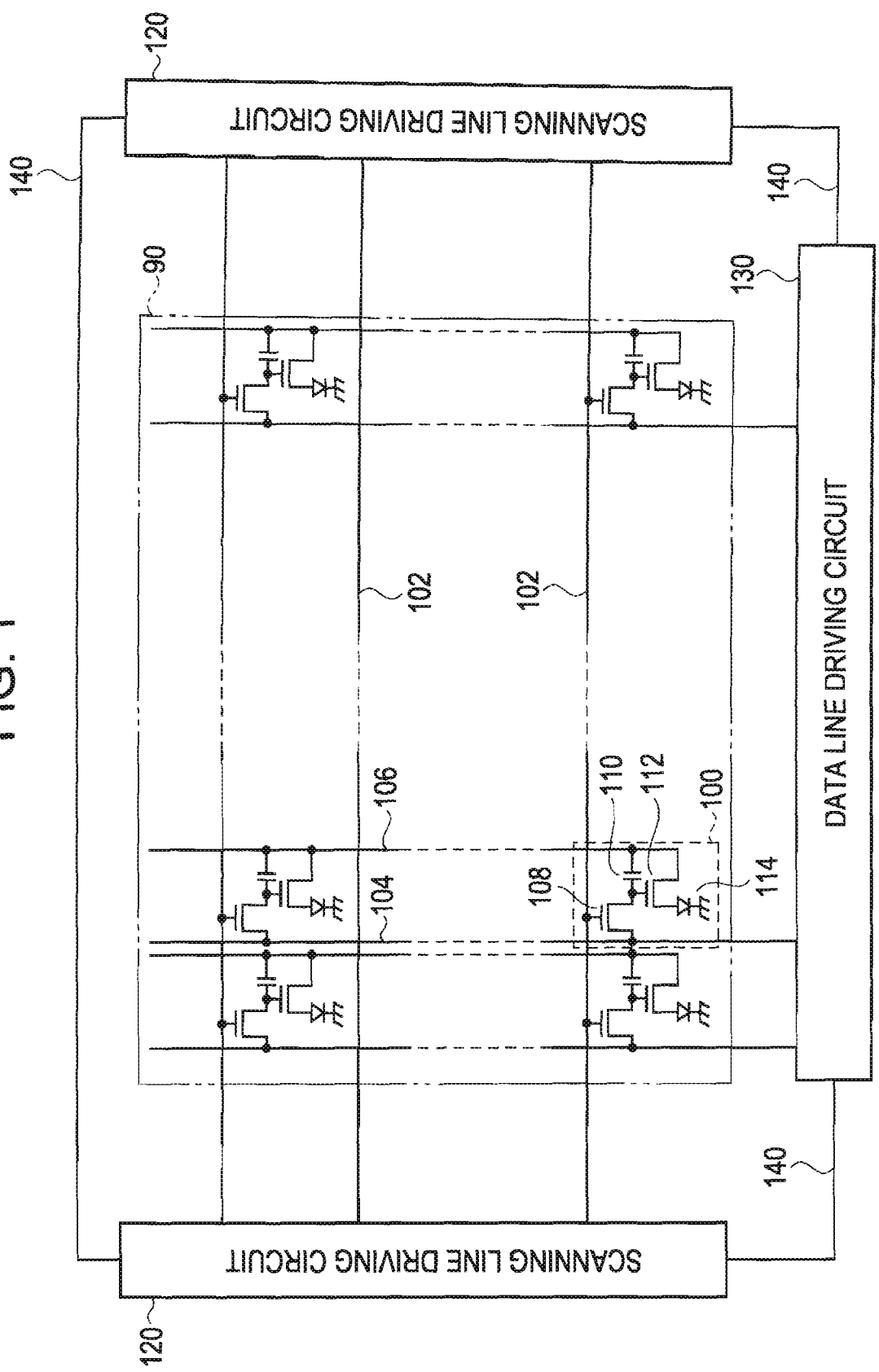
FIG. 1 is a circuit diagram showing the whole configuration of an active matrix type-EL device.

Hereinafter, as an embodiment of the present inventions a top emission-type electro-luminescence (hereinafter, referred to as "EL") device that emits white light from a light emitting layer formed on the whole surface of an image display area to be described later and displays a color image by modulating the white light into three primary colors using a color filter will be described as an example with reference to the accompanying drawings. In the drawings used for descriptions below, in order to represent constituent members in recognizable sizes, scales of the constituent members are individually changed appropriately.

The invention relates to a gap control layer formed on a layer disposed above a color filter layer, and has a feature in the cross-section thereof. Thus, first, the configuration of an active matrix-type EL device common to embodiments to be described later and a general example will be described with reference to FIG. 1.

FIG. 1 is a circuit diagram showing the whole configuration of an active matrix type-EL, device. In an image display area 90, a plurality of scanning lines 102, a plurality of data lines 104 perpendicular to the plurality of scanning lines 102, and a plurality of power supply lines 106 extending in parallel with the plurality of data lines 104 are formed. In addition, around intersections between the scanning lines 102 and the data lines 104, pixel areas 100 are disposed. In other words, in the image display areas 90, the pixel areas 100 are disposed in the shape of a matrix. In each pixel area 100, a total of three elements including a switching TFT 108 having a gate electrode to which a scanning signal is supplied through a scanning line 102, a holding capacitor 110 that holds a pixel signal supplied from a data line 104 through the switching TFT 108, and a drive TFT 112 having a gate electrode to which the pixel signal held by the holding capacitor 110 is supplied are formed.

At the end of one terminal of the drive TFT 112, a light emitting element 114 in which a drive current is flown from the power supply line 106 through the drive TFT is formed. As will be described later, the light emitting element 114 includes a pixel electrode as an anode electrically connected to the one terminal, a cathode layer that has a common electric potential, and a function layer pinched by the pixel electrode and the cathode layer.

The pixel electrode is patterned as a rectangle having a predetermined gap from adjacent pixel electrodes in correspondence with the drive TFT 112. The function layer and the cathode layer are formed over the whole range of the image display area 90, and the function layer is pinched by the pixel electrode and the cathode layer.

When the scanning line 102 is driven and the switching TFT 108 is turned on, the electric potential of the data line 104 at that moment is maintained by the holding capacitor 110, and the level of the drive TFT 112 is determined in accordance with the state of the holding capacitor 110. Then, a drive current flows from the power supply line 106 to the anode through the drive TFT 112, and the drive current flows to the cathode layer through the function layer. As a result, areas (portions) of the function layer and the light emitting layer which face the anode electrically connected to the drive TFTs 112 emit light in accordance with the magnitude of the drive current, and the emitted light is irradiated externally as one of the primary colors by a color filter to be described later. By allowing an arbitrary current to flow through an arbitrary area of the function layer and the light emitting layer, a color image is formed in the image display area 90.

In the vicinity of the image display area 90, a scanning line driving circuit 120 and a data line driving circuit 130 are formed. To the scan lines 102, scan signals in accordance with various signals that are supplied from a peripheral circuit not shown in the figure are sequentially supplied from the scanning line driving circuit 120. To the data lines 104, image signals are supplied from the data line driving circuit 133. To the power supply lines 106, pixel driving currents are supplied from a peripheral circuit not shown in the figure. In addition, the operations of the scanning line driving circuit 120 and the data line driving circuit 130 are configured to be synchronized with each other on the basis of synchronization signals supplied from peripheral circuits through synchronization data lines 140.

First Embodiment

Figure 2:
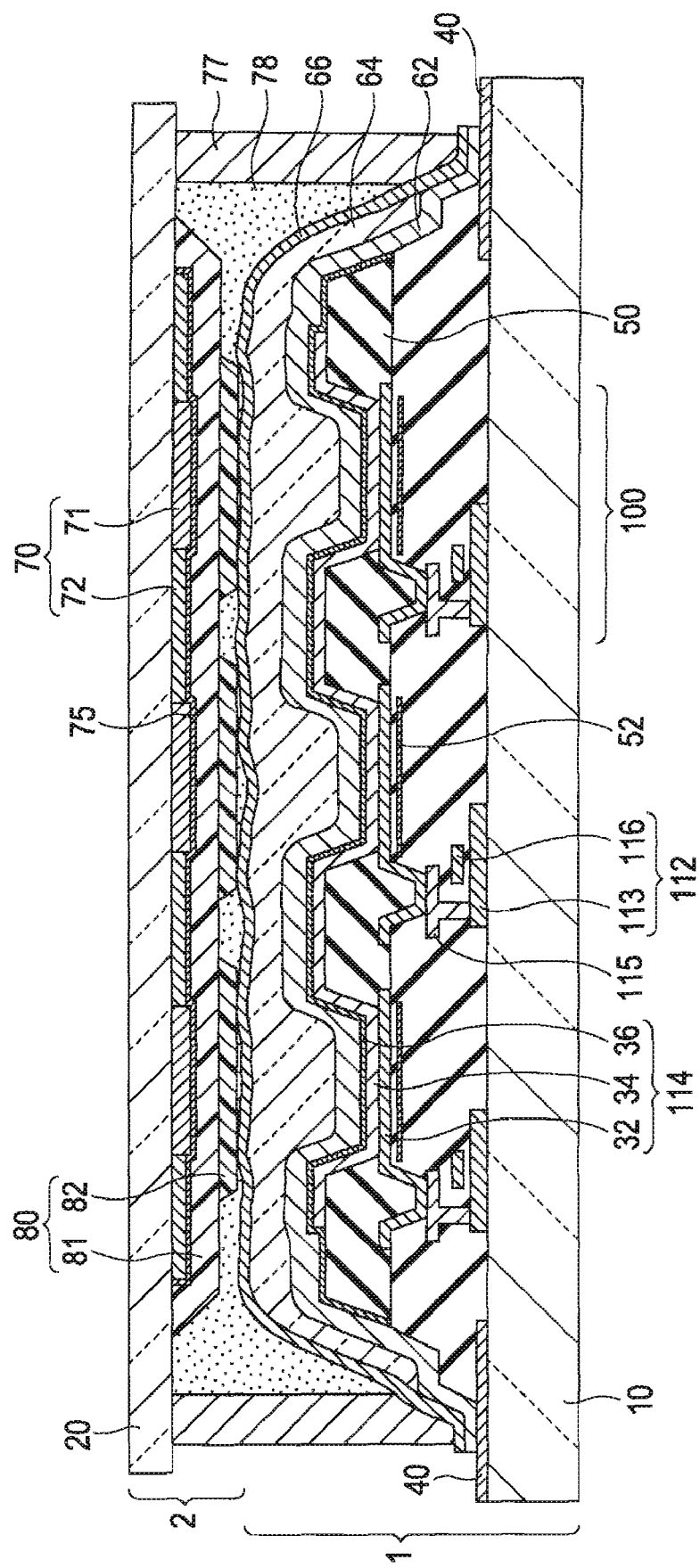
FIG. 2 is a schematic diagram showing a cross-section of an EL device according to a first embodiment of the invention.

FIG. 2 is a schematic diagram showing the cross-section of a top emission type EL device according to a first embodiment of the invention. The figure is shown with primary focus on a color filter layer 70, a gap control layer 80, and a sealing layer which are needed for a description of the invention. Other elements such as a switching TFT 108, a holding capacitor 110, and the like that are not needed for the description of the invention are omitted or simplified in the figure.

The EL device according to this embodiment is formed by bonding a display base substrate 1 and a protection substrate 2 using a bonding layer to be described later. The display base substrate 1 includes a first substrate 10, a display body layer formed on the first substrate 10, and a sealing layer formed on the display body layer. Here, the display body layer represents a group of elements formed on the first substrate 10, that is, an aggregation of elements, wirings, and the like and includes a light emitting element 114 and the like which are formed on the image display area 90 (see FIG. 1) and peripheral circuits 40 which are formed in the vicinity of the image display area 90. The peripheral circuit 40 collectively refers to the above-described scanning line driving circuit 120, the data line driving circuit 130, the synchronization data lines 140, and the like. The sealing layer is an aggregation of a plurality of layers including a gas barrier layer to be described later.

In each of the pixel areas 100 disposed to have a matrix shape in the image display area 90, a drive TFT 112 and a light emitting element 114 are formed. The light emitting element 114 includes a pixel electrode 32, a function layer 34 having a light emitting layer, and a cathode layer 36 that is a common electrode. The drive TFT 112 includes a semiconductor layer 113, a gate electrode 116, and a gate insulating film not shown in the figure.

Between constituent elements such as the drive TFT 112 and the gate electrode 116, the drain electrode 115 and the light emitting element 114, or the like, an interlayer insulation film made of silicon oxynitride or the like is formed for electrically insulating the constituent members. Only required parts thereof are electrically connected to each other through a contact hole formed on the interlayer insulation film.

Since the EL device according to this embodiment is a top emission type, the pixel electrode 32 is not needed to have translucency. However, the outermost surface of the pixel electrode 32 is formed of ITO (indium Tin Oxide) in consideration of a height of the work function and patterning. The cathode layer 36 is required to have a low work function, and thus, the film thickness thereof is formed to be as thin as about 10 nm using a Mg—Ag alloy (magnesium-silver alloy) for acquiring translucency needed for the top emission type EL device.

The function layer 34 is pinched by the pixel electrode 32 and the cathode layer 36 and emits light on the basis of the flow of an electric current. In the EL device according to this embodiment, on the pixel electrode 32, an ATP (trially-lamine) multimer thin film serving as a hole injecting layer, a TPD (triphenyldiamine) thin film serving as a hole transporting layer, a styrylamine-based thin film, to which anthracene-based dopants (blue color) or rubrene-based dopants (yellow color) are added, serving as a light emitting layer, an Alq3 (aluminum quinolinol) thin film serving as an electron injecting layer, and a LiF (lithium fluoride) thin film serving as an electron injection buffer layer are sequentially stacked to be formed.

A partition wall 50 is made of an insulation material and is formed to have a lattice shape as an upper layer of the pixel electrode 32 for surrounding the pixel electrode. The cathode layer 36 and the function layer 34 are formed over approximately the whole surface of the image display area 90 including an area above the partition wall 50. On the partition wall 50, the pixel electrode 32 and the function layer 34 are insulated from each other, and the function layer 34 does not emit light. In other words, the partition wall 50 partitions light emitting elements 114 disposed to be adjacent to each other. On a lower layer of the function layer 34 and the pixel electrode 32, a reflection plate 52 made of a metal material in correspondence with the top emission type is formed and efficiently reflects a color light generated from the function layer 34 to the upper display surface side.

The sealing layer includes a cathode protecting layer 62, an organic buffer layer 64, and a gas barrier layer 66 which are sequentially stacked on the cathode layer 36 in the mentioned order. The cathode protecting layer 62 is a thin layer made of a silicon oxide or silicon oxynitride. The film of the cathode protecting layer 62 is formed by using a vapor growth method such as a CVD method having a low stress in which the process is performed at a low temperature. The cathode protecting layer 62 serves to protect the cathode layer 36 at a time when the organic buffer layer 64 is formed. The organic buffer layer 64 is made of a translucent material such as an epoxy compound. The organic layer 64 is formed by using a coating method such as a slit die coating method or a screen printing method and then hardened. The organic layer 64 has high flatness. The function layer 34, the cathode protecting layer 62, and the like together form a very thin layer having a film thickness of 100 to 500 μm, and thus a level difference of 3 to 5 μm which is formed by the partition wall 50 is not removed, and accordingly, unevenness of the partition wall 50 remains on the first substrate 10 without a substantial change. Thus, before the gas barrier layer 66 is formed, an epoxy compound is coated with a thickness of 3 to 5 μm so as to approximate flatten the level difference for preventing a film defect, distortion, or a variance of the film thickness of the gas barrier layer 66. The gas barrier layer 66 is formed of a dense material that is made of silicon oxynitride and a silicon nitride and has high water resistance and relatively high nitrogen content. The film of the gas barrier layer 66 is formed by using a vapor growth method such as a sputtering method using a high-density plasma source, a CVD method, or an ion plating method. In order to reduce installation costs, the gas barrier layer 66 may be formed by using equipment that is used for forming the cathode protecting layer 62.

The protection substrate 2 is formed by sequentially stacking a color filter layer 70, an overcoat 75, and a gap control layer 80 on the second substrate 20 in the mentioned order. In order to cope with the top emission type, the second substrate 20 needs to have translucency and thus is formed of glass or the like or transparent plastic such as polyethylene terephthalate, acryl resin, polycarbonate, or the like. On the rear side (a side on which the color filter layer and the like are not formed) of the second substrate 20, an UV (ultraviolet ray) shielding/ absorbing layer, a light reflection preventing layer, a heat dissipation layer, or the like may be formed.

The color filter layer 70 includes a color filter 71 that passes light having a wavelength in a predetermined range and a black matrix 72 that can block visible light. In the color filter 71, a filter that passes one of red light, green light, and blue light is formed in the shape of a matrix in accordance with disposition of the light emitting element 114, and the black matrix 72 is formed in the shape of a lattice surrounding the color filter. Each light emitting element 114 is separated by the partition wall 50, and thus the black matrix 72 is formed to be approximately overlapped with the partition wall 50 in a vertical direction.

Although the overcoat 75 is a translucent thin film formed on the whole surface of the color filter layer 70 for the purpose of protecting the surface of the color filter layer 70 from a general sphere-shaped gap control layer, the overcoat 75 is provided in a multi-layer structure of a gap control layer according to an embodiment of the invention as needed. On the overcoat 75, a gap control layer 80 including a first gap control layer 81 and a second gap control layer 82 is formed, and the gap control layer 80 maintains a constant gap between the color filter layer 70 and the light emitting element 114. Since both sides of the gap control layer 80 of the EL device according to this embodiment are overlapped with at least parts of the light emitting element 114 and the color filter 71, the gap control layer 80 is formed of a translucent material such as a resin. As described later, the first gap control layer 81 and the second gap control layer 82 have different moduli of elasticity.

The display base substrate 1 and the protection substrate 2 are bonded by a bonding layer formed by two types of adhesives including a peripheral sealing agent 77 and a transparent filling agent 78. The peripheral sealing agent 77 is a member having functions for acquiring positional precision for bonding the display base substrate 1 and the protection substrate 2 together and for preventing protrusion of the transparent filling agent 78 as a bank. The periphery of the protection substrate 2 is surrounded by the peripheral sealing agent 77, and a concave section is formed by the protection substrate 2 and the peripheral sealing agent 77. Then, the transparent filling agent 78 is supplied to the concave section, and the concave section is covered with the display base substrate 1 and pressed. Then, the peripheral sealing agent 77 and the transparent filling agent 78 are solidified in a state that the gas barrier layer 66 and the second gap control layer 82 are brought into contact with each other for bonding the gas barrier layer 66 and the second gap control layer 82. The properties of both agents and the like will be described later.

The above described state that the gas barrier layer 66 and the second gap control layer 82 are brought into contact with each other does not mean that the gas barrier layer 66 and the second gap control, layer 82 are brought into contact on the whole areas thereof but means that at least parts thereof are brought into contact with each other. On the surface of the gas barrier layer 66, there is slight unevenness due to the effect of the lower layer. Accordingly, although the second gap control layer 82 is formed on the whole surface of the image display area 90, there is a portion (area) in which the gas barrier layer 66 and the second gap control layer 82 are not brought into contact with each other in a case where the display base substrate 1 and the protection substrate 2 are bonded together.

As described above, in the EL device according to this embodiment, the first gap control layer 81 and the second gap control layer 82 have different moduli of elasticity, and the moduli of elasticity are determined in additional consideration of the above-described organic buffer layer 64. In particular the second gap control layer 82 is made of a material having a Young's modulus (Young's modulus) lower than the first gap control layer 81 and the organic buffer layer 64. For example, the first gap control layer 81 and the organic buffer layer 64 are formed of an epoxy resin of 3 to 10 GPa, and the second gap control layer 82 is formed of an acryl resin of 1 to 3 GPa. The function for maintaining the gap between the color filter 71 and the light emitting element 114 to be a constant is mainly performed by the first gap control layer 81. The second gap control layer 82 has a function for preventing the pressure (including pressure in a direction parallel to the display base substrate 1) for bonding the protection substrate 2 to the display base substrate 1 from incurring any damage of the gas barrier layer 66. Since the gas barrier layer 66 is formed of silicon oxynitride, and the gas barrier layer 66 has a modulus (100 GPa) of elasticity higher than the organic buffer layer 64 that is formed of an epoxy compound. Accordingly, the gas barrier layer 66 has a Young's modulus much higher than the second gap control layer 82.

Since it is more difficult for the gas barrier layer 66 to be deformed than the second gap control layer 82, only the second gap control layer 82 is deformed so as to absorb pressure in a case where the gas barrier layer 66 and the second gap control layer 82 are pressed each other in a bonding process, and damage such as a crack or depression of the gas barrier layer 66 is suppressed. Accordingly, the water vapor blocking function is maintained without incurring any damage such as a crack of the gas barrier layer 66 even in a case where the second gap control layer 82 is deformed in a bonding process, and thereby aged deterioration of the light emitting element 114 due to permeation of the water vapor or the like can be suppressed.

In addition, it is more difficult for the first gap control layer 81 to be deformed than the second gap control layer 82, the pressure for bonding is almost absorbed by deformation of the second gap control layer 82, and accordingly, deformation of the first gap control layer 81 is suppressed. Accordingly, the gap between the light emitting element 114 and the color filter 71 is maintained to be constant, and thereby deterioration of display capability is suppressed. In addition, the film thickness of the first gap control layer 81 can be set to an arbitrary value, and the gap can be decreased, compared to an average diameter of a general sphere-shaped gap control layer of 3 to 5 μm. Therefore, even in a case where the area of the black matrix 72 is decreased by increasing the area of the color filter layer 70 occupying the protection substrate 2, leakage of emitted light does not occur, and an EL device having a high aperture ratio and lower power consumption can be acquired. In addition, by reducing the gap, the positional precision for bonding the display base substrate 1 and the protection substrate 2 together can be improved.

In addition, it is more difficult for the organic buffer layer 64 to be deformed than the second gap control layer 82, and deformation of the gas barrier layer 66 due to pressure can be suppressed. In the pressing state, the organic buffer layer 64 and the second gap control layer 82 press (applies pressures) each other with the gas barrier layer 66 interposed therebetween. The gas barrier layer 66 is a thin film made of silicon oxynitride, and in a case where the lower layer is deformed by being pressed, it is easy to generate a crack or the like in the deformed spot. However, since the applied pressure is absorbed by the deformation of the second gap control layer 82, the deformation of the organic buffer layer 64 is suppressed. As a result, occurrence of a crack or the like on the gas barrier layer 66 is suppressed.

As described above, according to this embodiment, the irregularity of the gap in the image display area 90 can be suppressed further, and aged deterioration due to permeation of water vapor can be suppressed additionally. Therefore, an EL device having display capability and reliability which are improved further can be acquired.

Figure 3:
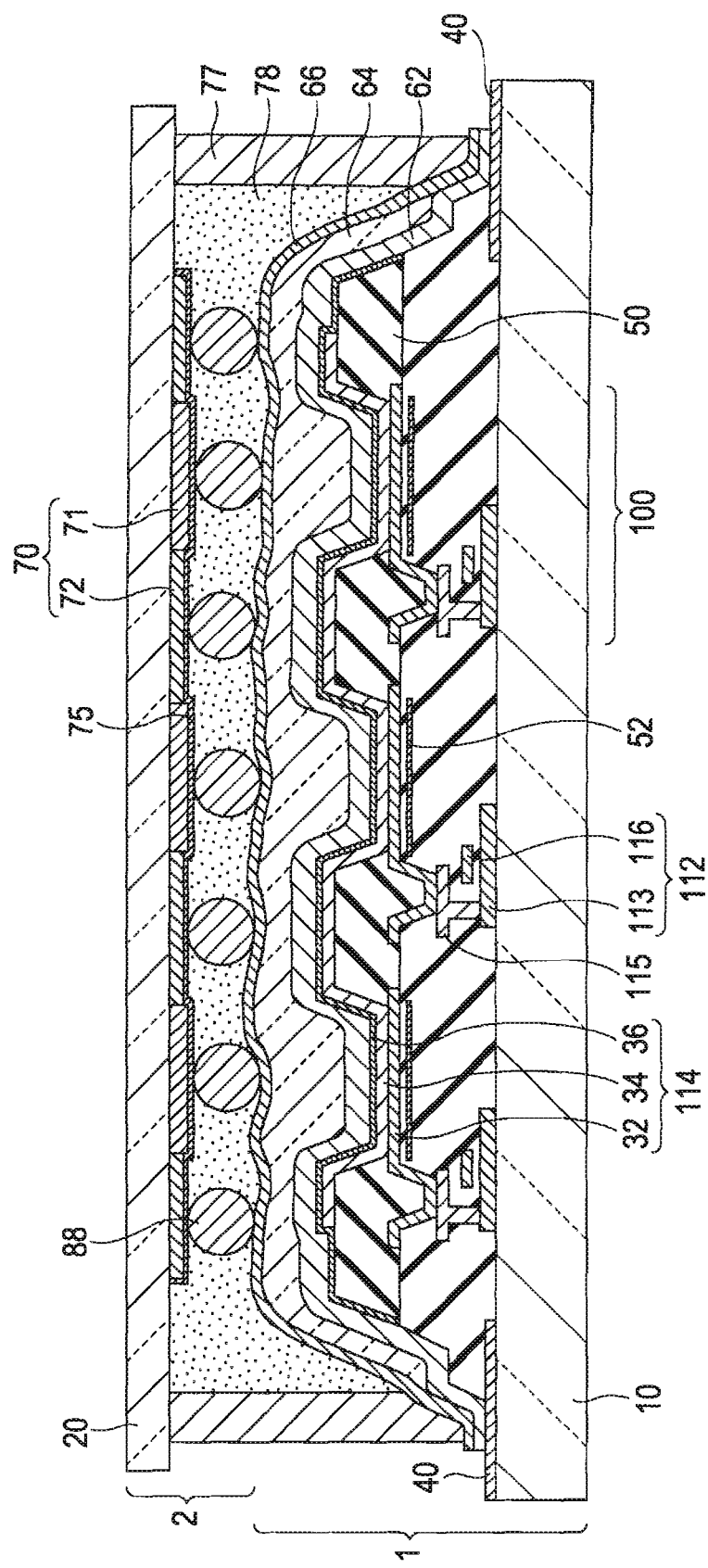
FIG. 3 is a schematic diagram showing a cross-section of an EL device using a general sphere-shaped gap control layer.

FIG. 3 is a schematic diagram showing a cross-section of an EL device in which a gap is acquired by using a general sphere-shaped gap control layer as a comparative example. Only the feature of the gap control layer of the EL device shown in FIG. 3 is different from the EL device according to the first embodiment shown in FIG. 2. Thus, a same reference numeral is assigned to a common constituent element, and a description thereof is omitted here.

The protection substrate 2 is formed by stacking the color filter layer 70 and the overcoat 75 on the second substrate 20, and is bonded to the display base substrate 1 through a sphere-shaped gap control layer 88. In particular, a sphere-shaped gap control layer 88 having a diameter of 3 to 5 μm is bonded by a mixed-in transparent filling agent 78.

Since the sphere-shaped gap control layer 88 is formed of a single material from the surface thereof to the center, it is difficult to absorb the pressure in the bonding process for preventing deformation of other constituent elements, that is, the gas barrier layer 66 and the like while the gap is maintained to have a constant value. In addition, the sphere-shaped gap control layer 88 having a small diameter may be aggregated easily and it is difficult to disperse the sphere-shaped gap control layer uniformly. In addition, generally, since a standard sphere-shaped gap control layer 88 is purchased, it is difficult to set the gap to an arbitrary value, and the aperture ratio cannot be improved by reducing the gap to be equal to or smaller than 3 μm. The EL device according to this embodiment responds to such problems. Therefore, an EL device having an improved display quality can be provided at a reduced production cost.

Material of Gap Control Layer and the Like

As a material for forming the first gap control layer 81, a phenol resin, an epoxy resin, a novolak resin, a methacrylate resin, an acryl resin of which moduli of elasticity increase after a hardening process, an olefin resin having a water content smaller than 0.01 wt % for not causing an air bubble due to remaining moisture, or the like may be used. It is preferable that the Young's modulus of the first gap control layer 81 is about 3 to 10 GPa, so that the Young's modulus of the first gap control layer becomes larger than that of the second gap control layer 82. The film thickness (layer thickness) is preferably in the range of 1 to 5 μm in consideration of adjusting the gap and flattening the level difference between the color filter 71 and the black matrix 72. As the method of forming the first gap control layer, a patterning process may be performed by a photolithography process after spin coating or slit die coating or patterning and coating may be performed by using a printing method such as a screen printing method or an ink jet printing method.

As the material of the second gap control layer 82, a material having a low Young's modulus is required, and thus a rubber-based resin such as isoprene rubber or styrene butadiene rubber, a urethane resin, a silicon resin, a low-density polyethylene, or the like may be preferentially used. The Young's modulus of the second gap control layer is preferably in the range of 1 to 3 GPa to be smaller than that of the first gap control layer 81. As a method of forming the second gap control layer, a photolithography process using a rubber-based positive photosensitive material such as isoprene rubber may be used. In addition, a non-photosensitive material may be coated by using a screen printing method, an ink jet printing method, or the like for forming the second gap control layer. The film depth of the second gap control layer is preferentially formed to be thin in a range capable of absorbing the unevenness of the surface of the gas barrier layer 66 for suppressing the irregularity of the gap, and is preferably in the range of 0.1 to 1 μm.

The transparent filling agent 78 is a liquid material that is hardened by heating and is not influenced by UV irradiation, and includes a basic ingredient of a raw material and a hardening agent. The basic ingredient of the raw material is needed to be an organic compound material that has a superior fluidity and does not contain a volatile component such as a solvent. Preferably, the basic ingredient of the raw material is an epoxy monomer/oligomer that has a epoxy group and has a molecular weight equal to or smaller than 3000. For example, there are a bisphenol A-type epoxy oligomer, a bisphenol F-type epoxy oligomer, a phenol novolak-type epoxy oligomer, and the materials may be used independently or combined to be used together.

As the hardening agent, a strong hardening agent having a superior electric insulation property that can form a hardening film having a superior heat resistance property may be used preferably. In addition, a hardening agent of an additive polymerization type that has a superior transparency and less hardening irregularity may be used preferably. An acid anhydride-based hardening agent such as 3-methyl-1,2,3,6-tetrahydro phthalic anhydride, methyl-3,6-endmethylene, 1,2,3,6-tetrahydro phthalic anhydride, or a polymer thereof may be preferably used. The hardening process is performed by heating in the range of 60 degrees centigrade to 100 degrees centigrade. Since a hardening material having a superior heat resistance is formed, the hardening material is appropriate for a use requiring nigh reliability. For a use not requiring heat resistance, an amine-based hardening agent that is hardened at room temperature may be used. The viscosity of the hardening agent is adjusted to be in the range of 100 to 2000 mPa·s before the hardening agent is used.

The peripheral sealing agent 77 is a material that is hardened by UV (ultraviolet), and includes a basic ingredient of an epoxy raw material and a hardening agent. The basic ingredient is preferably an epoxy monomer/oligomer that has an epoxy group and has a molecular weight equal to or smaller than 3000, and a same material as for the transparent filling agent 78 is used. As the hardening agent, a photo-reactive initiation agent such as diazonium salt, diphenyl iodonium salt, or iron arene complex is used, and positive ion polymerization reaction occurs by UV irradiation. In addition, a delayed reaction type for which the viscosity increases at a time when a predetermined time elapses after the UV irradiation can extremely decrease the viscosity in the coating and bonding process to 10,000 to 50,000 mPa·s, and thus the bonding and weighting process can easily decrease at least the gap distance. Accordingly, the delayed-reaction type may be preferably used. Since the peripheral sealing agent is used on an outer side of the image display area 90, the peripheral sealing agent is not needed to have translucency.

Second Embodiment

FIGS. 4A to 4D are cross-section views showing a process of bonding the display base substrate 1 and the protection substrate 2 according to a second embodiment of the invention. In order to be adjusted for an actual bonding process, the embodiment shown in FIG. 2 is vertically reversed in this embodiments. In this embodiment, in order to represent interference between the gas barrier layer 66 and the second gap control layer 82, other constituent elements of the display base substrate 1 other than the gas barrier layer 66 are not show in the figure. In addition, to a constituent element of the protection substrate 2 common to that according to the first embodiment, a same reference numeral is attached, and a description thereof is omitted.

Figure 4A:
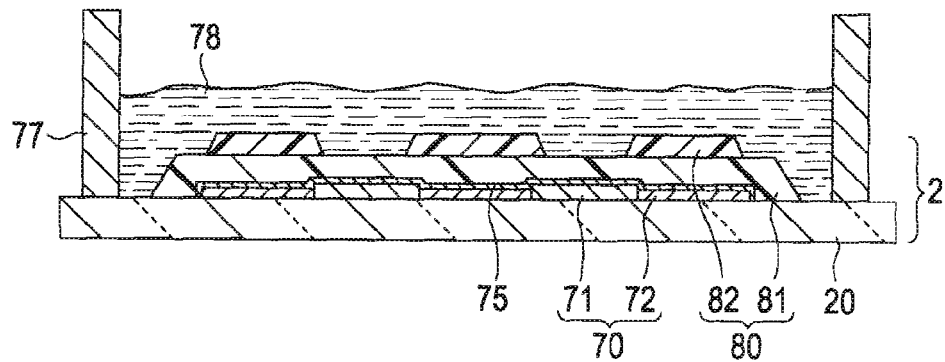
FIGS. 4A to 4D are cross-section views showing a process of bonding a display base substrate and a protection substrate according to a second embodiment of the invention.

First, as shown in FIG. 4A, a peripheral sealing agent 77 is formed in the shape of a bank on the periphery of the protection substrate 2. The peripheral sealing agent 77 is supplied to the protection substrate 2 by using a needle dispensing method, a screen printing method, or the like. By using a material having viscosity of 5 to $20 \times 10^4$ Pa/s, the bank shape of the peripheral sealing agent 77 can be maintained, particularly, without a hardening process.

Then, a transparent filling agent 78 is supplied to a concave section that is formed by the peripheral sealing agent 77 and the protection substrate 2. As the method of supplying the transparent filing agent 7, a jet dispense method is preferably used. Both the peripheral sealing agent 77 and the transparent filling agent 78 are materials that are hardened by heating treatment for bonding.

Then, the peripheral sealing agent 77 is temporarily hardened by UV irradiation. It is preferable that luminance of UV is about 30 mW/cm$^2$ and light intensity of UV is about 2000 mJ/cm$^2$. By UV irradiation, the viscosity of the peripheral sealing agent 77 becomes higher than that at a time when the coating process is performed and is not completely solidified. The transparent filling agent 78 is a material that is not hardened by UV irradiation. Accordingly, in this stage, the transparent filling agent 78 is maintained to have low viscosity in the liquid phase.

Figure 4B:
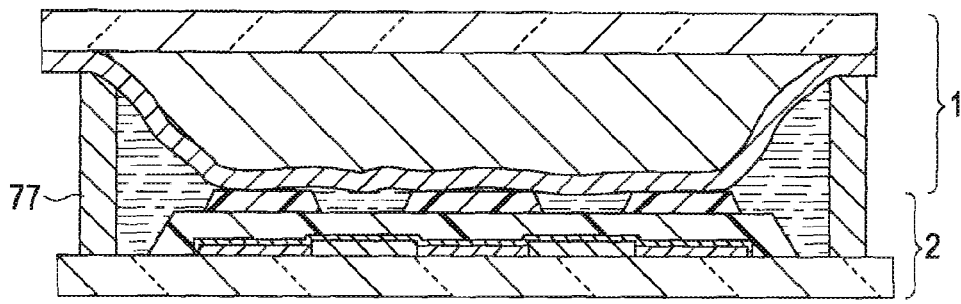

Next, as shown in FIG. 4B, the display base substrate 1 is disposed so as to cover the protection substrate 2 by using a vacuum bonding device. In the outer periphery portion of the display substrate 1, the gas barrier layer 66 and the like are formed on the peripheral circuit 40 (see FIG. 2), and the gas barrier layer is configured to be brought into contact with the peripheral sealing agent 77. In the center area, that is, an inner area of the outer peripheral portion, the second gap control layer 82 and a part of the gas barrier layer 60 are brought into contact with each other.

In this process, bonding is performed under a vacuum environment of about 1 Pa, and when the peripheral sealing agent 77 is brought into contact with the display base substrate 1, the inside thereof is in a status that the transparent filling agent 78 and vacuum spaces are mixed. Then, when the atmosphere of the inside is returned to an atmospheric pressure level, the above-described vacuum area is filled with the transparent filling agent 78. The supply amount of the transparent filling agent 78 is chosen such that the transparent filling agent 78 completely fills out the above-described space and the amount pushed outside at a time of bonding is minimized.

Figure 4C:
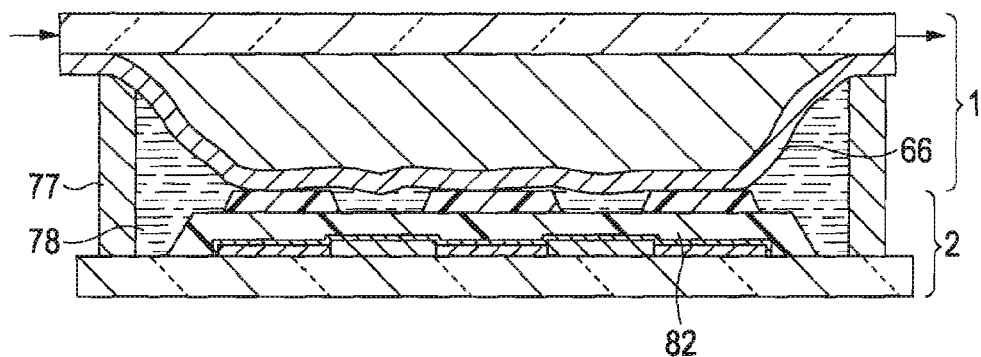

Then, as shown in FIG. 4C, the display base substrate 1 and the protection substrate 2 are relatively moved horizontally so as to adjust positions of both the substrates. In other words the light emitting element 114 (see FIG. 2) and the color filter layer 70 are adjusted to be in optimal positions with each other, and thereby the EL device can display an appropriate image. Depending on the vacuum bonding device, this process may be performed simultaneously with the process shown in FIG. 4B.

At this moment, since the display base substrate 1 and the protection substrate 2 move in a state that the gas barrier layer 66 and the second gap control layer 82 are brought into contact with each other, the gas barrier layer 66 and the second gap control layer 82 rub each other. However, since the second gap control layer 82 has a low Young's modulus and can be easily deformed, the second gap control layer 82 can absorb the unevenness of the surface of the gas barrier layer 66 in accordance with the above-described movement.

Accordingly, occurrence of a crack or the like in the gas barrier layer 66 due to application of pressure can be suppressed. Here, between the second gap control layer 82 and the color filter layer 70, the first gap control layer 81 having a Young's modulus higher than that of the second gap control layer 82 is interposed, and accordingly, the gap is maintained regardless of the deformation of the second gap control layer 82. In addition, since the peripheral sealing agent 77 has not been completely hardened, the peripheral sealing agent has flexibility in some degree. Thus, the peripheral sealing agent is deformed in accordance with the above-described movement so as to absorb unevenness of the gas barrier layer 66, and thereby occurrence of a gap between the peripheral sealing agent 77 and the display base substrate 1 can be suppressed.

Figure 4D:
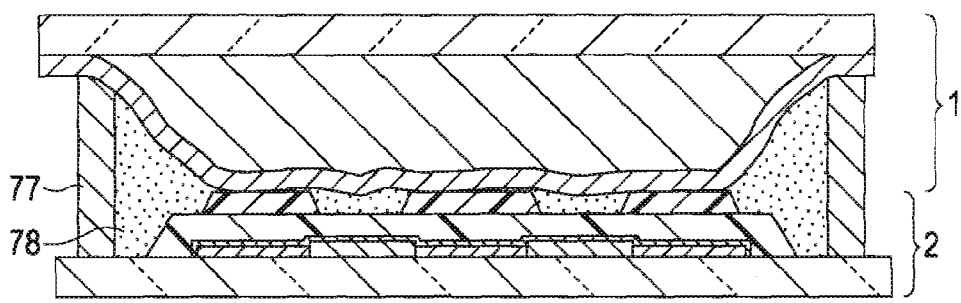

Finally, as shown in FIG. 4D, the transparent filling agent 78 is completely hardened by a heating process performed at 60 to 100 degrees centigrade. Commonly, since the transparent filling agent 78 is pressed by a differential pressure different from the atmospheric pressure, the gap can be stabilized without being pressed. However, the transparent filling agent may be heated while being pressed. The peripheral sealing agent 77 is completely hardened in the stage, and serves as an adhesive together with the transparent filling agent 78.

As described above, the process of bonding the display base substrate 1 and the protection substrate 2 is completed. Thereafter, an EL device can be acquired though a process of connecting wirings to the peripheral circuit 40 and the like.

According to this embodiment, gap control layers of two layers having different moduli of elasticity are used, and accordingly, the gap between the light emitting element 114 and the color filter layer 70 can be maintained, and relative positions of the light emitting element 114 and the color filter layer 70 can be adjusted without damaging the gas barrier layer 66. Therefore, the quality and display capability of the EL device can be improved further.

Third Embodiment

Figure 5:
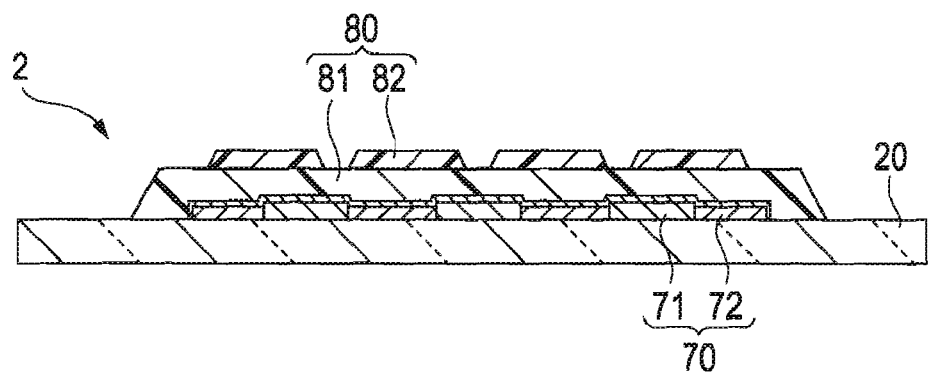
FIG. 5 shows a protection substrate according to a third embodiment of the invention.

FIG. 5 shows a protection substrate 2 according to a third embodiment of the invention. From this embodiment to an eighth embodiment of the invention, the gap control layer 80 is featured and the display base substrate 1 and the like are the same as those of the first and second embodiments, and thus only the protection substrate 2 is shown in the figure. In addition, to a constituent element common to this embodiment and the first embodiment, a same reference numeral is attached, and a description thereof is omitted.

The feature of the gap control layer 80 of the protection substrate 2 according to this embodiment is that the film thickness of the second gap control layer 82 is smaller than that of the first gap control layer 81. As described above, according to an embodiment of the invention, the first gap control layer 81 serves to maintain the gap has a constant value, and the second gap control layer 82 serves to absorb the pressure in the bonding process and suppress occurrence of a crack and the like in the gas barrier layer 66 (see FIG. 2). Here, the reason why the crack and the like occurs in the gas barrier layer 66 is that a local, force is applied to the gas barrier layer 66 due to unevenness of the surface of the gas barrier layer 66. In other words, the film thickness of the second gap control layer 82 depends on the degree of unevenness of the surface of the gas barrier layer 66.

Accordingly, when the unevenness of the surface of the gas barrier layer 66 is reduced by improving flatness of the organic buffer layer 64 (see FIG. 2), the first gap control layer 81 can be formed thick by forming the second gap control layer 82 to be thin, and therefore the irregularity of the gap can be further suppressed. As a result, an EL device having further improved display capability can be acquired.

Fourth Embodiment

Figure 6:
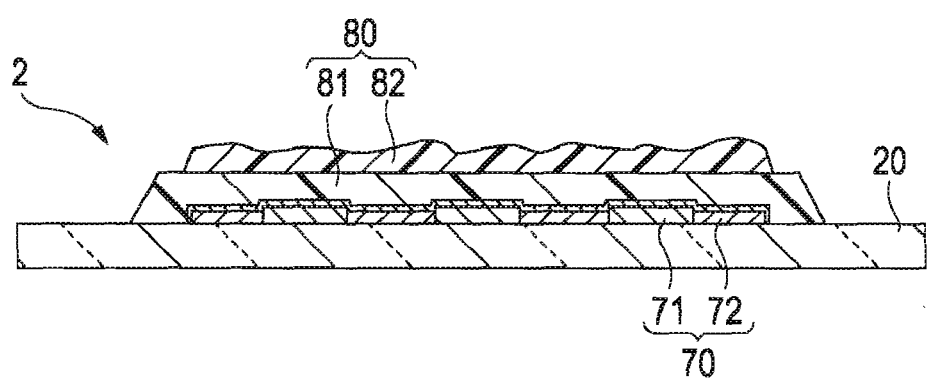
FIG. 6 shows a protection substrate according to a fourth embodiment of the invention.

FIG. 6 shows a protection substrate 2 according to a fourth embodiment of the invention. The feature of the gap control layer 80 of the protection substrate 2 according to this embodiment is that concave and convex portions are formed on the surface of the second gap control layer 82. In addition, the first gap control layer 81 is formed to be flat.

The pressure that incurs the crack and the like in the gas barrier layer 66 (see FIG. 2) is generated when the protection substrate 2 is pressed vertically and the protection substrate 2 and the display base substrate 1 (see FIG. 2) are horizontally moved so as to adjust positions thereof. When the flatness of the gas barrier layer 66 is improved and the unevenness of the surface are reduced, the gas barrier layer 66 and the second gap control layer 82 are brought into contact with each other in a form of approximate surface contact. As a result, when both the substrates relatively move horizontally, large resistance occurs, and accordingly, the pressure applied to the gas barrier layer 66 increases. In that case, when concave and convex portions are arranged on the surface of the second gap control layer 82 as in this embodiment, the above-described resistance decreases, and accordingly, the pressure applied to the gas barrier layer 66 can be suppressed. Accordingly, the position adjustment between the protection substrate 2 and the display base substrate 1 can be easily performed, and precision of the position adjustment is improved. As a result, an EL device having further improved display capability can be acquired.

Although the concave and convex portions are formed on the second gap control layer 82 in FIG. 6, a same advantage can be acquired in a case where the second gap control layer 82 is flattened using a general technique after the concave and convex portions are formed on the first gap control layer 81.

Fifth Embodiment

Figure 7:
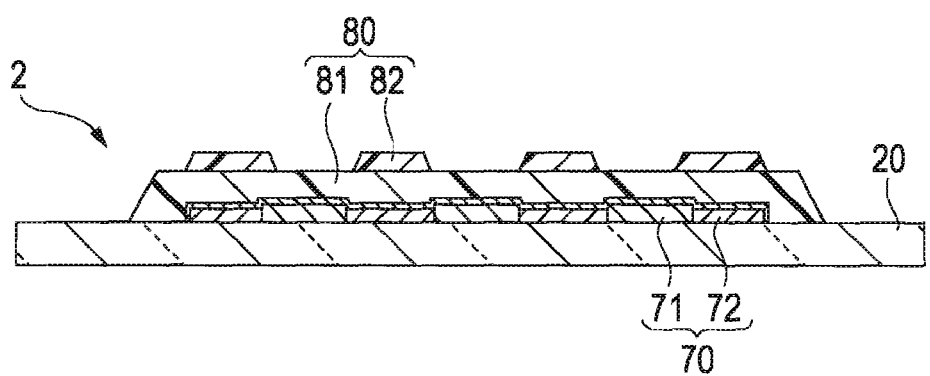
FIG. 7 shows a protection substrate according to a fifth embodiment of the invention.

FIG. 7 shows a protection substrate 2 according to a fifth embodiment of the invention. The feature of the gap control layer 80 of the protection substrate 2 according to this embodiment is that the second gap control layer 82 is formed only on the black matrix 72. In addition, the first gap control layer 81 is formed on the whole surface.

As described above, since the black matrix 72 blocks light generated from the light emitting element 114 (see FIG. 2), a constituent element that is disposed only in an area overlapped with the black matrix 72 is not needed to have permeability. Thus, when the second gap control layer 82 is formed only on the black matrix 72 as shown in the figure, the second gap control layer 82 may be formed of an opaque material. Accordingly, the material of the second gap control layer 82 can be chosen with focus on the Young's modulus, the cost, or the like, and therefore an EL device having a low manufacturing cost can be acquired without deteriorating the display quality.

Sixth Embodiment

Figure 8:
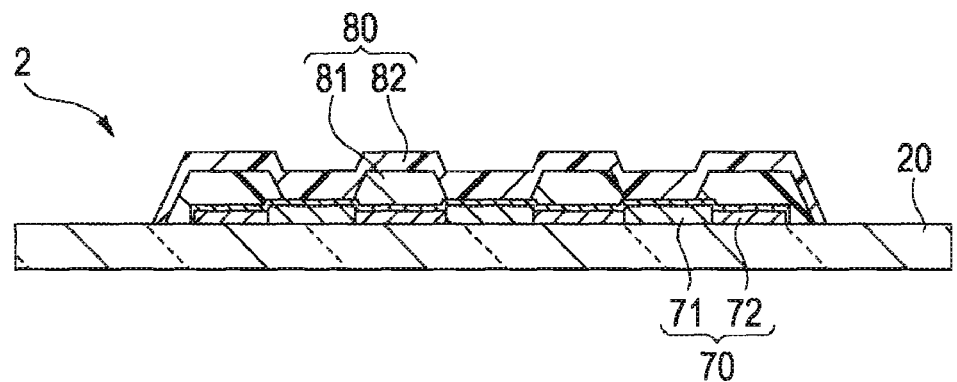
FIG. 8 shows a protection substrate according to a sixth embodiment of the invention.

FIG. 8 shows a protection substrate 2 according to a sixth embodiment of the invention. The feature of the gap control layer 80 of the protection substrate 2 according to this embodiment is that the first gap control layer 81 is formed only on the black matrix 72 and the second gap control layer 82 is formed on the whole surface in the upper layer.

According to this embodiment, the first gap control layer 81 is not needed to have permeability, and the material of the first gap control layer 81 can be chosen with focus on the Young's modulus, the cost, or the like, and therefore an EL device having a low manufacturing cost can be acquired without deteriorating the display quality.

Seventh Embodiment

Figure 9:
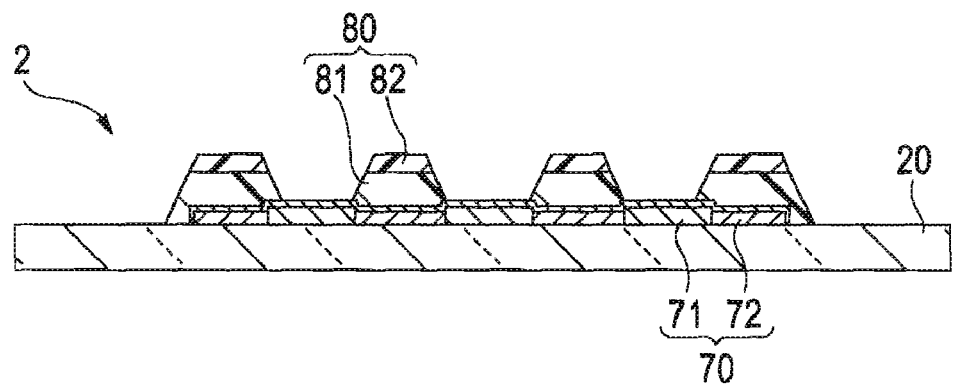
FIG. 9 shows a protection substrate according to a seventh embodiment of the invention.

FIG. 9 shows a protection substrate 2 according to a seventh embodiment of the invention. The feature of the gap control layer 80 of the protection substrate 2 according to this embodiment is that both the first gap control layer 81 and the second gap control layer 82 are formed only on the black matrix 72.

According to this embodiment, materials of the first gap control layer 81 and the second gap control layer 82 can be chosen with focus on the Young's modulus, the cost, or the like, and therefore an EL device having a lower manufacturing cost can be acquired without deteriorating the display quality.

According to this embodiment, widths of the second gap control layer 82 and the first gap control layer 81 may be different from each other.

Eighth Embodiment

Figure 10:
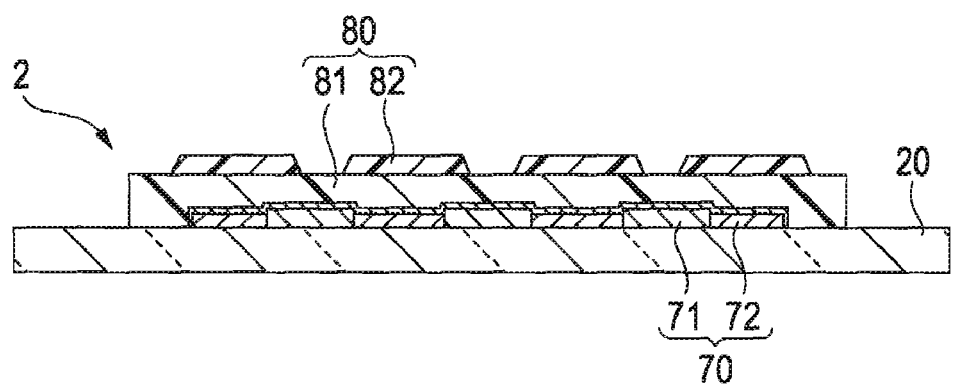
FIG. 10 shows a protection substrate according to an eighth embodiment of the invention.

FIG. 10 shows a protection substrate 2 according to an eighth embodiment of the invention. The feature of the gap control layer 80 of the protection substrate 2 according to this embodiment is that a strong forward tapered shape is formed on a side portion of the second gap control layer 82. According to this embodiment, the side portion of the second gap control layer 82 is brought into contact with a convex portion of the surface of the gas barrier layer 66 (see FIG. 2) at an angle, and thus resistance generated by rubbing between the gas barrier layer 66 and the second gap control layer 82 at the time of horizontal movement of the display base substrate 1 (see FIG. 2) and the protection substrate 2 can be reduced, and accordingly position adjustment can be easily performed. Thus, position adjustment can be performed with higher precision, and thereby, an EL device having a further improved display capability can be acquired. The forward tapered shape may be formed by patterning the material, of the second gap control layer 82 using a screen printing method or the like, and the tilt angle may be increased by a melting process at the time of hardening process using heating.

The entire disclosure of Japanese Patent Application No. 2007-131319, filed May 17, 2007 is expressly incorporated by reference herein.

What is claimed is:
1. An electro-luminescence device comprising:
a display base substrate including
a display body layer including a switching element and a light emitting element electrically connected to the switching element, the display body layer being disposed above the display base substrate; and
a sealing layer including a gas barrier layer having at least a function for blocking water vapor, the sealing layer being disposed above the display body layer;
a protection substrate including a first gap control layer disposed above the protection substrate and a second gap control layer disposed on the first gap control layer, the first gap control layer and the second gap control layer having different Young's modulus; and
a bonding layer interposed between the second gap control layer and the gas barrier layer so as to bond the display base substrate and the protection substrate,
wherein the second gap control layer has a Young's modulus lower than those of the first gap control layer and the gas barrier layer.

2. An electro-luminescence device comprising:
a display base substrate including
a display body layer including a switching element and a light emitting element electrically connected to the switching element, the display body layer being disposed above the display base substrate; and
a sealing layer including a gas barrier layer having at least a function for blocking water vapor, the sealing layer being disposed above the display body layer;
a protection substrate including a color filter layer disposed above the protection substrate, a first gap control layer disposed above the color filter layer, and a second gap control layer disposed on the first gap control layer; and
a bonding layer interposed between the second gap control layer and the gas barrier layer so as to bond the display base substrate and the protection substrate,
wherein the Young's modulus of the second gap control layer is lower than those of the first gap control layer and the gas barrier layer.

3. The electro-luminescence device according to claim 2, wherein the sealing layer includes at least three types of material layers including a cathode protecting layer, an organic buffer layer, and the gas barrier layer which are sequentially stacked on the display body layer.

4. The electro-luminescence device according to claim 3, wherein the Young's modulus of the organic buffer layer is higher than that of the second gap control layer.

5. The electro-luminescence device according to claim 2, wherein the second gap control layer is patterned and is disposed locally on the first gap control layer.

6. The electro-luminescence device according to claim 2,
wherein the color filter layer is formed by a color filter colored in one of three primary colors including red, green, and blue colors and a black matrix that is formed of a light shielding material and spaces the color filter apart, and
wherein at least any one between the first gap control layer and the second gap control layer is disposed only on the black matrix.

7. The electro-luminescence device according to claim 2, wherein the second gap control layer is patterned and a shape tapered forward at 10 to 60 degrees is formed on a side portion of the second gap control layer which is formed by the patterning process.

8. The electro-luminescence device according to claim 2, wherein concave and convex portions are formed on a surface of the second gap control layer.

9. The electro-luminescence device according to claim 2, wherein a film thickness of the second gap control layer is smaller than that of the first gap control layer.

10. A method of manufacturing an electro-luminescence device, the method comprising bonding a first substrate having a gas barrier layer that is formed of a material having a high Young's modulus for protecting a group of elements formed on a surface of the first substrate, the gas barrier layer being disposed in an uppermost layer of the first substrate and a second substrate having a surface on which at least two gap control layers are included such that the gas barrier layer and the gap control layers are brought into contact with each other,
wherein an uppermost gap control layer of the gap control layers is formed of a material having a Young's modulus lower than a Young's modulus of the gap control layers disposed below the uppermost gap control layer and the gas barrier layer, and
wherein an unevenness of a surface of the gas barrier layer is absorbed by the uppermost gap control layer.

11. A method of manufacturing an electro-luminescence device, the method comprising bonding a display base substrate including a display body layer including a switching element and a light emitting element electrically connected to the switching element, the display body layer being disposed above the display base substrate, a sealing layer including a gas barrier layer having at least a function for blocking water vapor, the sealing layer being disposed above the display body layer, and a protection substrate including a color filter layer, a first gap control layer formed on the color filter layer, and a second gap control layer formed on the first gap control layer, and by overlapping and weighting the display base substrate and the protection substrate such that the second gap control layer and the gas barrier layer are brought into contact with each other,
wherein the second gap control layer is formed of a material having a Young's modulus lower than those of the first gap control layer and the gas barrier layer, and
wherein the second gap control layer contacts the gas barrier layer without depressing the gas barrier layer while absorbing an unevenness of a surface of the gas barrier layer and maintains a gap between the display body layer and the color filter layer to be approximately constant.

12. The method according to claim 11, wherein the bonding of the display base substrate and the protection substrate includes relatively moving the display base substrate and the protection substrate horizontally in a state that the second gap control layer and the gas barrier layer are brought into contact with each other.

13. The electro-luminescence device according to claim 1, wherein
the first gap control layer is made of a phenol resin, an epoxy resin, a novolak resin, a methacrylate resin or an acryl resin having the Young's modulus between 3 and 10 GPa; and
the second gap control layer made of a rubber-based resin having the Young's modulus between 1 and 3 GPa.

* * * * *